United States Patent
Jiang et al.

(10) Patent No.: US 9,035,807 B2
(45) Date of Patent: May 19, 2015

(54) HIERARCHICAL ENTROPY ENCODING AND DECODING

(75) Inventors: Wenfei Jiang, Beijing (CN); Kangying Cai, Beijing (CN); Ping Hu, Beijing (CN)

(73) Assignee: Thomson Licensing, Issy les Moulineaux (FR)

( * ) Notice: Subject to any disclaimer, the term of this patent is extended or adjusted under 35 U.S.C. 154(b) by 0 days.

(21) Appl. No.: 14/240,066

(22) PCT Filed: Aug. 25, 2011

(86) PCT No.: PCT/CN2011/078936
§ 371 (c)(1),
(2), (4) Date: Feb. 21, 2014

(87) PCT Pub. No.: WO2013/026210
PCT Pub. Date: Feb. 28, 2013

(65) Prior Publication Data
US 2014/0184430 A1    Jul. 3, 2014

(51) Int. Cl.
*H03M 5/00*      (2006.01)
*H03M 7/00*      (2006.01)
(Continued)

(52) U.S. Cl.
CPC ............... *H03M 7/00* (2013.01); *G06T 17/005* (2013.01); *G06T 9/001* (2013.01); *G06T 9/40* (2013.01); *H04N 19/96* (2014.11)

(58) Field of Classification Search
CPC ........... G06T 9/001; G06T 9/40; G06T 9/005; H04N 19/96; H03M 7/00
USPC ............................................. 341/55, 87, 107
See application file for complete search history.

(56) References Cited

U.S. PATENT DOCUMENTS 5,901,182 A    5/1999  Kot
6,026,198 A *  2/2000  Okada ........................... 382/247
(Continued)

FOREIGN PATENT DOCUMENTS

CN    1695306    11/2005
CN    1741616     3/2006
(Continued)

OTHER PUBLICATIONS

Devillers et al., "Geometric Compression for Interactive Transmission," IEEE Proceedings Visualization 2000, pp. 319-326, Salt Lake City, UT, USA.
(Continued)

*Primary Examiner* — Khai M Nguyen
(74) *Attorney, Agent, or Firm* — Robert D. Shedd; Paul P. Kiel; Xiaoan Lu

(57) ABSTRACT

A particular implementation receives geometry data of a 3D mesh, and represents the geometry data with an octree. The particular implementation partitions the octree into three parts, wherein the symbols corresponding to the middle part of the octree are hierarchical entropy encoded. To partition the octree into three parts, different thresholds are used. Depending on whether a symbol associated with a node is an S1 symbol, the child node of the node is included in the middle part or the upper part of the octree. In hierarchical entropy encoding, a non-S1 symbol is first encoded as a pre-determined symbol 'X' using symbol set S2={S1, 'X'} and the non-S1 symbol itself is then encoded using symbol set S0 (S2 ⊂ S0), and an S1 symbol is encoded using symbol set S2. Another implementation defines corresponding hierarchical entropy decoding. A further implementation reconstructs the octree and restores the geometry data of a 3D mesh from the octree representation.

23 Claims, 13 Drawing Sheets

(51) Int. Cl.
*G06T 17/00* (2006.01)
*G06T 9/00* (2006.01)
*G06T 9/40* (2006.01)
*H04N 19/96* (2014.01)

(56) References Cited

U.S. PATENT DOCUMENTS

| | | | |
|---|---|---|---|
| 6,100,824 | A | 8/2000 | MacLeod et al. |
| 6,542,640 | B1 * | 4/2003 | Morihara et al. ............. 382/229 |
| 6,677,868 | B2 | 1/2004 | Kerofsky et al. |
| 7,925,103 | B2 | 4/2011 | Lee et al. |
| 2003/0128140 | A1 * | 7/2003 | Xie et al. ...................... 341/107 |
| 2005/0180340 | A1 | 8/2005 | Lee |
| 2009/0202160 | A1 | 8/2009 | Kim et al. |
| 2010/0207941 | A1 | 8/2010 | Lee et al. |

FOREIGN PATENT DOCUMENTS

| | | |
|---|---|---|
| WO | WO2010144461 | 12/2010 |
| WO | WO2010149645 | 12/2010 |

OTHER PUBLICATIONS

Peng et al., "Geometry-guided Progressive Lossless 3D Mesh Coding with Octree (OT) Decomposition," ACM, 2005, this is author's version of the work, May 23, 2005, 8 pages. The definitive version was published in ACM Trans. on Graphics, (vol. 24, No. 3, Jul. 2005, http://doi.acm.org/10.1145/1073204.1073237, 8 pages.

Marpe et al., "Video Compression Using Nested Quadtree Structures, Leaf Merging, and Improved Techniques for Motion Representation and Entropy Coding," IEEE Transactions on Circuits and Systems for Video Technology, vol. 20, No. 12, Dec. 2010, pp. 1676-1687.

* cited by examiner

FIG. 10A

| Header | Subtream 1 | Subtream 2 | Subtream 3 |
|---|---|---|---|
| 1010 | 1020 | 1030 | 1040 |

| layer_index | No_non_S1 | location_non_S1₁ | ... | location_non_S1ₙ | len_substream1 | len_substream2 |
|---|---|---|---|---|---|---|
| 1050 | 1060 | 1070 | 1075 | 1075 | 1080 | 1090 |

1000

HIERARCHICAL ENTROPY ENCODING AND DECODING

CROSS-REFERENCE TO RELATED APPLICATIONS

This application claims the benefit, under 35 U.S.C. §365 of International Application PCT/US2011/078936, filed 25 Aug. 2011, which was published in accordance with PCT Article 21(2) on 28 Feb. 2013, in English.

TECHNICAL FIELD

This invention relates to entropy encoding and decoding, and more particularly, to entropy encoding and decoding for a sequence of symbols with different statistics in different portions of the sequence.

BACKGROUND

A sequence of symbols, wherein the symbols are chosen from an alphabet or a symbol set, can be compressed by entropy coding. An entropy coding engine assigns codewords for symbols based on the statistical model, i.e., the probability distributions of symbols. In general, more frequently used symbols are entropy coded with fewer bits and less frequently occurring symbols are entropy coded with more bits.

Entropy coding has been studied for decades. Basically, there are three types of entropy coding methods: variable length coding (VLC), like Huffman coding, arithmetic coding, and dictionary-based compression, like Lempel-Ziv (LZ) compression or Lempel-Ziv-Welch (LZW) compression.

The VLC codes use integer number of bits to represent each symbol. Huffman coding is the most widely used VLC method. It assigns fewer bits to a symbol with greater probability, while assigning more bits to a symbol with a smaller probability. Huffman coding is optimal when the probability of each symbol is an integer power of ½. Arithmetic coding can allocate a fractional number of bits to each symbol so that it can approach the entropy more closely. Huffman coding and arithmetic coding have been widely used in existing image/video compression standards, e.g., JPEG, MPEG-2, H.264/AVC. The LZ or LZW utilizes a table based compression model where table entries are substituted for repeated strings of data. For most LZ methods, the table is generated dynamically from earlier input data. The dictionary based algorithm has been employed in, for example, GIF, Zip, PNG standards.

SUMMARY

According to a general aspect, if a symbol in a sequence of symbols is determined not to belong to a first symbol set, a pre-determined symbol is encoded to represent the determined symbol using a statistical model for the first symbol set and the pre-determined symbol, and the determined symbol is encoded using a statistical model for a second symbol set.

According to another general aspect, geometry data of a 3D mesh is received and the geometry data is represented using a tree data structure. The tree data structure is partitioned into three parts, wherein a first sequence of symbols corresponds to a middle part of the tree data structure, a second sequence of symbols corresponds to an upper part of the tree data structure and a third sequence of symbols corresponds to a bottom part of the tree data structure. If a symbol in the first sequence of symbols is determined not to belong to a first symbol set, a pre-determined symbol is encoded to represent the determined symbol using a statistical model for the first symbol set and the pre-determined symbol, and the determined symbol is encoded using a statistical model for a second symbol set, wherein the second symbol set is a superset of the first symbol set and the pre-determined symbol does not belong to the second symbol set. When partitioning the tree data structure, child nodes of a node, the node being associated with a second symbol, are included in the upper part of the tree data structure if the second symbol does not belong to the first symbol set, and the child nodes of the node are included in the middle part of the tree if the second symbol belongs to the first symbol set.

According to another general aspect, a symbol is decoded from a bitstream using a statistical model for a first symbol set and a pre-determined symbol. If the symbol is determined to be the pre-determined symbol, a second symbol corresponding to the determined symbol is decoded from the bitstream using a statistical model for a second symbol set.

According to another general aspect, a symbol is decoded from a bitstream using a statistical model for a first symbol set and a pre-determined symbol. If the symbol is determined to be a pre-determined symbol, a second symbol corresponding to the symbol is decoded from the bitstream using a statistical model for a second symbol set, wherein the second symbol set is a superset of the first symbol set and the pre-determined symbol does not belong to the second symbol set. Another symbol is decoded from the bitstream using one of the statistical model for the second symbol set and a statistical model for the first symbol set. A tree data structure is reconstructed using decoded symbols, the decoded symbols including the second symbol and the another symbol. When reconstructing the tree data structure, symbols associated with child nodes for a node are decoded using the statistical model for the first symbol set and the pre-determined symbol if a third symbol associated with the node belongs to the first symbol set, and the symbols associated with the child nodes for the node are decoded using the statistical model for the second symbol set if the third symbol does not belong to the first symbol set. Geometry data of a 3D mesh are then restored from the tree data structure.

The details of one or more implementations are set forth in the accompanying drawings and the description below. Even if described in one particular manner, it should be clear that implementations may be configured or embodied in various manners. For example, an implementation may be performed as a method, or embodied as an apparatus, such as, for example, an apparatus configured to perform a set of operations or an apparatus storing instructions for performing a set of operations, or embodied in a signal. Other aspects and features will become apparent from the following detailed description considered in conjunction with the accompanying drawings and the claims.

BRIEF DESCRIPTION OF THE DRAWINGS

FIG. 10 is a pictorial representation of the format of a generated bitstream, in accordance with an embodiment of the present principles.

DETAILED DESCRIPTION

Spatial tree based approaches can be used to compress geometry data, such as random point positions and vertex positions of watertight 3D models. They organize input spatial points by an octree or a k-d tree. The tree is traversed and the information required for tree restoration is stored.

Initially, a bounding box is constructed around all points of a 3D model. The bounding box of all 3D points is regarded as a single cell in the beginning. To build the spatial tree, a cell is recursively subdivided until each non-empty cell is small enough to contain only one vertex and enable a sufficiently precise reconstruction of the vertex position. As vertex positions can be restored from central coordinates of corresponding cells, the spatial tree based algorithms may achieve multi-resolution compression with the same compression ratio as single-resolution compression algorithms.

Figure 1:
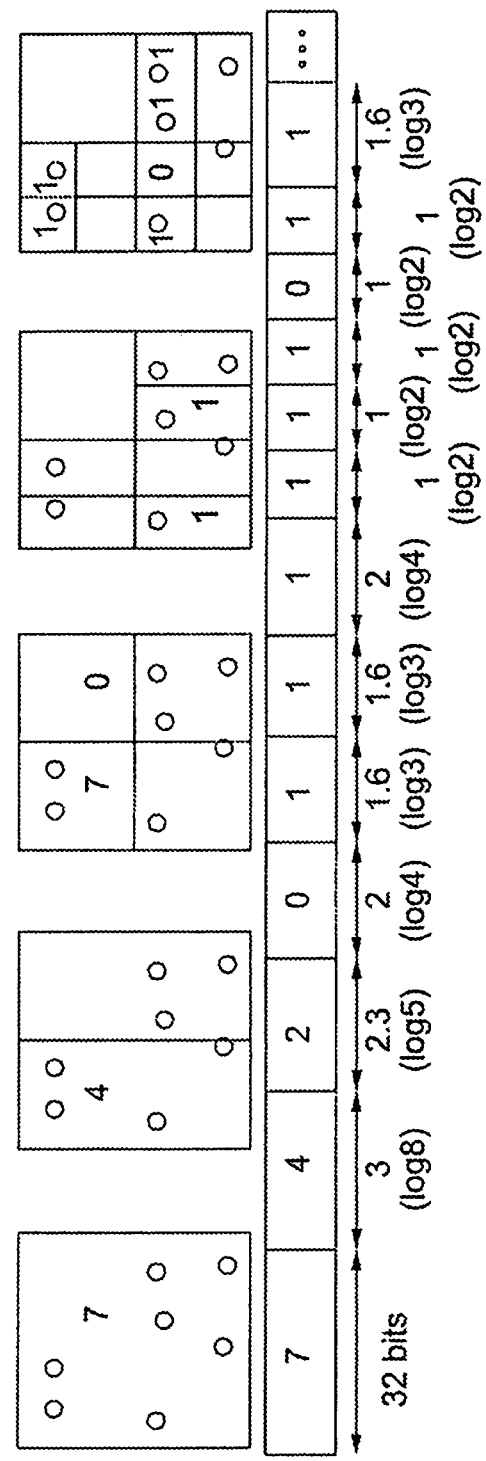
FIG. 1 is a pictorial representation of the principle of k-d tree based geometry coding in a 2D case.

In a k-d tree based approach, a cell is subdivided into two child cells and the number of vertices in one of the two child cells is encoded in each iteration, as shown in FIG. 1. If a parent cell contains p vertices, the number of vertices in one of the child cells can be encoded using $\log_2(p+1)$ bits with an arithmetic coder.

Figure 2:
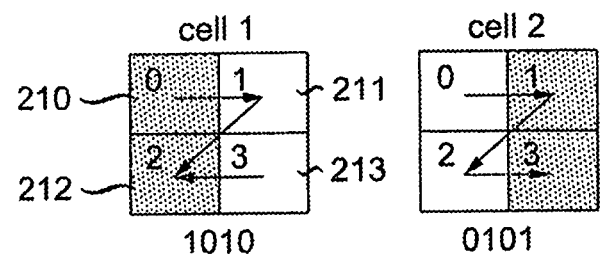
FIGS. 2 and 3 are pictorial representations of the principle of quadtree based geometry coding in a 2D case.
Figure 3:
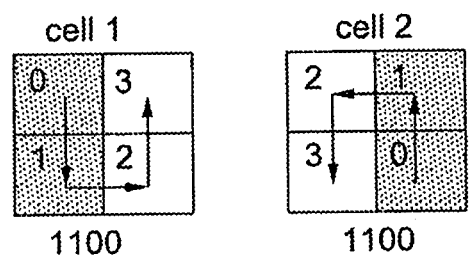

On the other hand, an octree based approach subdivides, in each iteration, a non-empty cell into eight child cells. For ease of illustration, 2D examples describing a quadtree are shown in FIGS. 2 and 3. The traversal orders are denoted by arrows. For encoding, a current parent cell is split into four child cells that are traversed in a pre-defined order, and a single bit per child cell indicates whether or not there is a point within the child cell. For example, in FIG. 2, the child cells of two parent cells 1 and 2 are traversed as shown in arrows, with non-empty child cells being colored gray. Child cells 210, 211, 212, and 213 of the first parent cell 1 are represented by a first sequence '1010'. Since the first and third child cells 210, 212 of the traversal are non-empty (i.e., contain one or more points), they are indicated by '1's. The second and fourth child cells 211, 213 are empty (i.e. contain no points), they are indicated by '0's. FIG. 3 shows the same cells using different traversals and resulting sequences.

Figure 4:
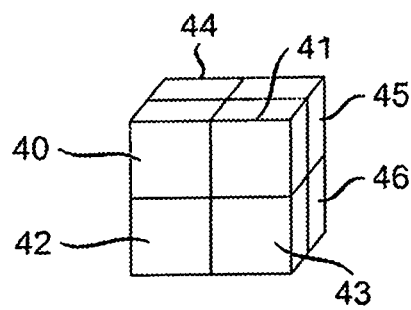
FIG. 4 is a pictorial representation of cell partitioning.

FIG. 4 shows parent and child cells of an octree scheme. In the octree scheme, a parent cell is split into eight child cells 40, ..., 46 (one hidden child cell behind lower left cell 42 is not shown). A possible traversal order could be left-right, up-down and front-back, resulting in a traversal sequence of cells 40-41-42-43-44-45-(hidden cell behind lower left cell 42)-46. Correspondingly, in the octree case the non-empty child cell configuration is denoted by 8-bit binaries, covering all the 255 possible combinations of empty and non-empty child cells. Separate encoding of the number of non-empty child cells is not required. TABLE 1 is an example of a sequence.

TABLE 1

| An exemplary sequence. |
| --- |
| 11111111 |
| 01100110 |
| 00111011 |
| 11001100 |
| ... |
| 00010000 |
| 00000010 |
| 00000010 |
| 10000000 |
| 00000001 |

Note that the specific traversal order of child cells within a parent cell is not very relevant for the present embodiments. In principle, any traversal order can be used for the present embodiments. In the following, the string of bits used to represent a child cell configuration is denoted as a symbol. In the example of TABLE 1, 8 bits are used for each symbol. In other implementations, the number of bits in a symbol may vary. For example, a 4-bit string is used to represent the child cell configuration for a quadtree, and thus, the number of bits for a symbol in the example of FIG. 2 is 4.

Figure 5:
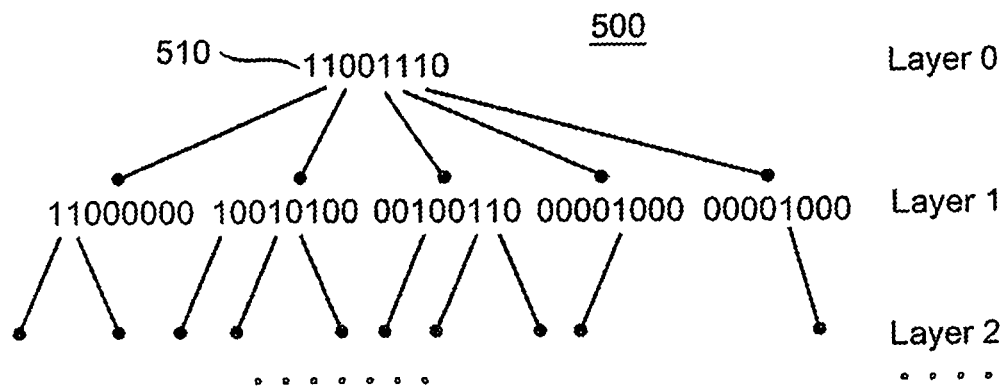
FIG. 5 is a pictorial representation of an exemplary octree.

FIG. 5 shows an example of an octree structure. Each node is associated with a symbol and each layer corresponds to a certain precision of the tree representation. The initial cell is divided into eight cells. Child cells 1, 2, 5, 6, and 7 contain more vertices and child cells 3, 4, and 8 are empty, resulting an 8-bit symbol 11001110, (510) to represent the child cell configuration at layer 0. Each non-empty child cells are further divided and the corresponding child cell configurations are represented in layer 1. The subdivision may continue until each non-empty cell only contains one vertex.

Using a breadth-first traversal of the octree, the vertex positions of a 3D mesh can be organized into a sequence of symbols. For the example in FIG. 5, the sequence of symbols becomes: 11001110, 11000000, 10010100, 00100110, 00001000, and 00001000.

TABLE 2

| An exemplary probability distribution. | |
| --- | --- |
| Symbol | p |
| 00000100 | 0.1280 |
| 00000010 | 0.1275 |
| 00001000 | 0.1167 |
| 10000000 | 0.1162 |
| 01000000 | 0.1128 |

TABLE 2-continued

An exemplary probability distribution.

| Symbol | p |
|---|---|
| 00010000 | 0.1118 |
| 00000001 | 0.1108 |
| 00100000 | 0.1098 |
| 00000101 | 0.0034 |
| 00001001 | 0.0030 |
| 01100000 | 0.0025 |
| 10000010 | 0.0025 |
| 10001000 | 0.0025 |
| 00000110 | 0.0020 |
| 00001100 | 0.0020 |
| 00100010 | 0.0020 |
| 10100000 | 0.0020 |
| 00000011 | 0.0015 |
| 00010001 | 0.0015 |
| 00010010 | 0.0015 |
| 00101000 | 0.0015 |
| 00110000 | 0.0015 |
| 01010000 | 0.0015 |
| 11000000 | 0.0015 |
| 00001010 | $10^{-3}$ |
| 00001011 | $10^{-3}$ |
| 00001111 | $10^{-3}$ |
| 00011000 | $10^{-3}$ |
| 00011100 | $10^{-3}$ |
| 00100110 | $10^{-3}$ |
| 00111011 | $10^{-3}$ |
| 01000010 | $10^{-3}$ |
| 01000100 | $10^{-3}$ |
| 01100010 | $10^{-3}$ |
| 01101000 | $10^{-3}$ |
| 10111011 | $10^{-3}$ |
| 11001100 | $10^{-3}$ |
| 11010000 | $10^{-3}$ |
| 11111111 | $10^{-3}$ |
| 00000111 | $5 \cdot 10^{-4}$ |

The probability distribution of the most frequently occurring symbols in a complex 3D model is shown in TABLE 2, in a descending order of the probability. As can be seen from TABLE 2, the symbols having only one '1' in the binary representation occur with a dominant probability (>93%). The geometric explanation may be that the vertices seldom share a cell after several subdivisions. That is, the bottom layers of the octree are dominated by symbols with only one '1', and other symbols occur more often at the top layers.

According to the present embodiments, we define two symbol sets: a universal symbol set, S0={1, 2, 3, . . . , 255}, including all possible symbols, and a symbol set, S1=(1, 2, 4, 8, 16, 32, 64, 128), including only symbols having one '1', i.e., the most frequently occurring symbols. Note for ease of representation, 8-bits binary strings are written as decimal numbers. A symbol is called an S1 symbol if it belongs to symbol set S1, and is called a non-S1 symbol otherwise.

To benefit from the statistical property of an octree, a commonly owned PCT application No. PCT/CN2011/077279, entitled "A model-adaptive entropy coding method for octree compression," proposes to partition the sequence represented by an octree into several sub-sequences which are coded with S0 or S1 adaptively. The indices of sub-sequence boundaries are coded as supplemental information. Because of the overhead of the supplemental information (e.g., 2 bytes for each index), generally large sub-sequences of consecutive S1 symbols are coded with symbol set S1.

When S1 symbols and non-S1 symbols both occur in a portion of the sequence, with S1 symbols having much higher probabilities, it is not efficient to divide such a portion into several sub-sequences because of the overhead. On the other hand, it is also not efficient to code such a portion with symbol set S0 as non-S1 symbols occur with low probabilities.

The present principles provide a hierarchical entropy encoding/decoding method and apparatus for efficiently compressing a sequence of symbols with varying statistics in different portions of the sequence. The following embodiments are mainly based on octree representations of 3D mesh models. However, the present principles may be adapted to other data sets or applications, as defined further below.

Figure 6:
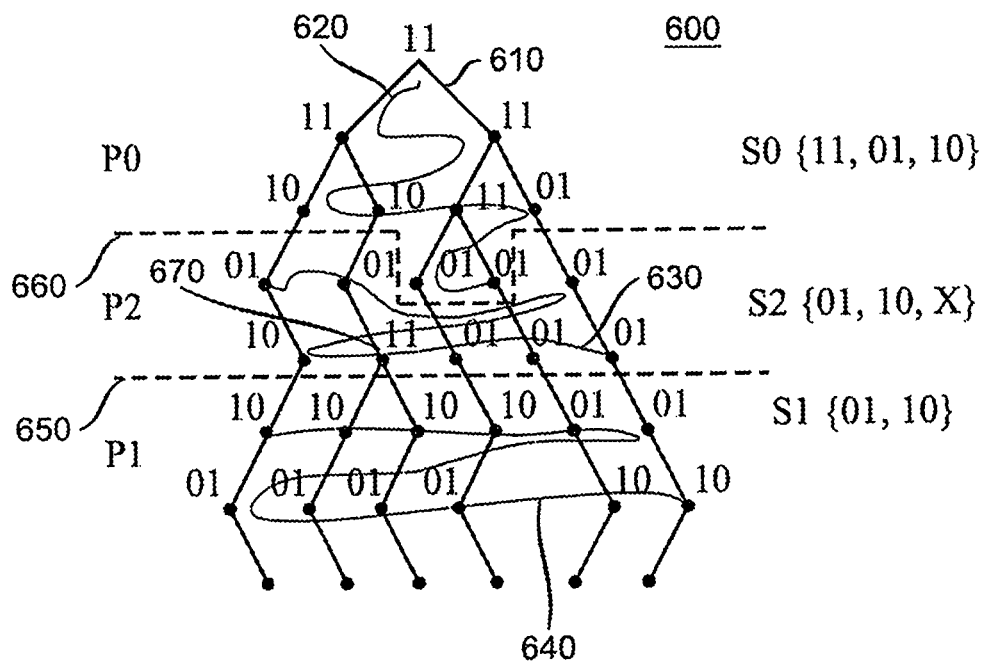
FIG. 6 is a pictorial representation depicting an example for generating sub-sequences of symbols, in accordance with an embodiment of the present principles.

FIG. 6 is an example illustrating how a sequence of symbols may be partitioned into three sub-sequences, and how three different symbol sets are used for encoding. In the present implementations, entropy encoding a sequence of symbols using a symbol set means that the statistical model for the symbol set, i.e., the probability of each symbol of the symbol set is used for entropy coding. Usually, the probabilities are trained using a large data set for a particular symbol set. Therefore, a symbol appearing in two different symbol sets may correspond to different probabilities in two symbol sets. For the example of TABLE 2, symbol '10000000' appears in both S0 and S1, and Prob('10000000')=0.1162 in S0, and Prob('10000000')=0.1245 in S1.

For ease of illustration, a binary tree 610, instead of an octree, is used in FIG. 6. Each node in this binary tree is associated with a 2-bit symbol. When the symbol '11', it has two child nodes; when the symbol is '10', it has only a left child node; and when the symbol is '01', it has only a right child node. Symbol set S0 contains all three possible symbols. In this example, symbol set S1 contains symbols '01' and '10', both having only one '1' in the bit string. Thus, in this example, symbol set S0 corresponds to the universal symbol set for the octree, and S1 corresponds to symbol set (1, 2, 4, 8, 16, 32, 64, 128).

In binary tree 610, symbols '10' and '01' dominate the bottom layers and '11' has a higher probability at upper layers. Binary tree 610 is divided into three parts and each part corresponds to a sub-sequence of symbols. Upper part P0 of the tree corresponds to sub-sequence 620, middle part P2 corresponds to sub-sequence 630, and bottom part P1 corresponds to sub-sequence 640. All symbols of symbol set S0 exist in sub-sequences 620 and 630, with '11' occurring more frequently in 620 than in 630. In this example, only symbols '01' and '10' appear in sub-sequence 640. It is possible that '11' can also be included in P1, but with a much lower probability.

Sub-sequence 620 is entropy encoded using symbol set S0, and sub-sequence 640 is entropy encoded using S1. Sub-sequence 630 is encoded with the hierarchical entropy encoding mechanism according to the principles of the present principles.

Figure 7:
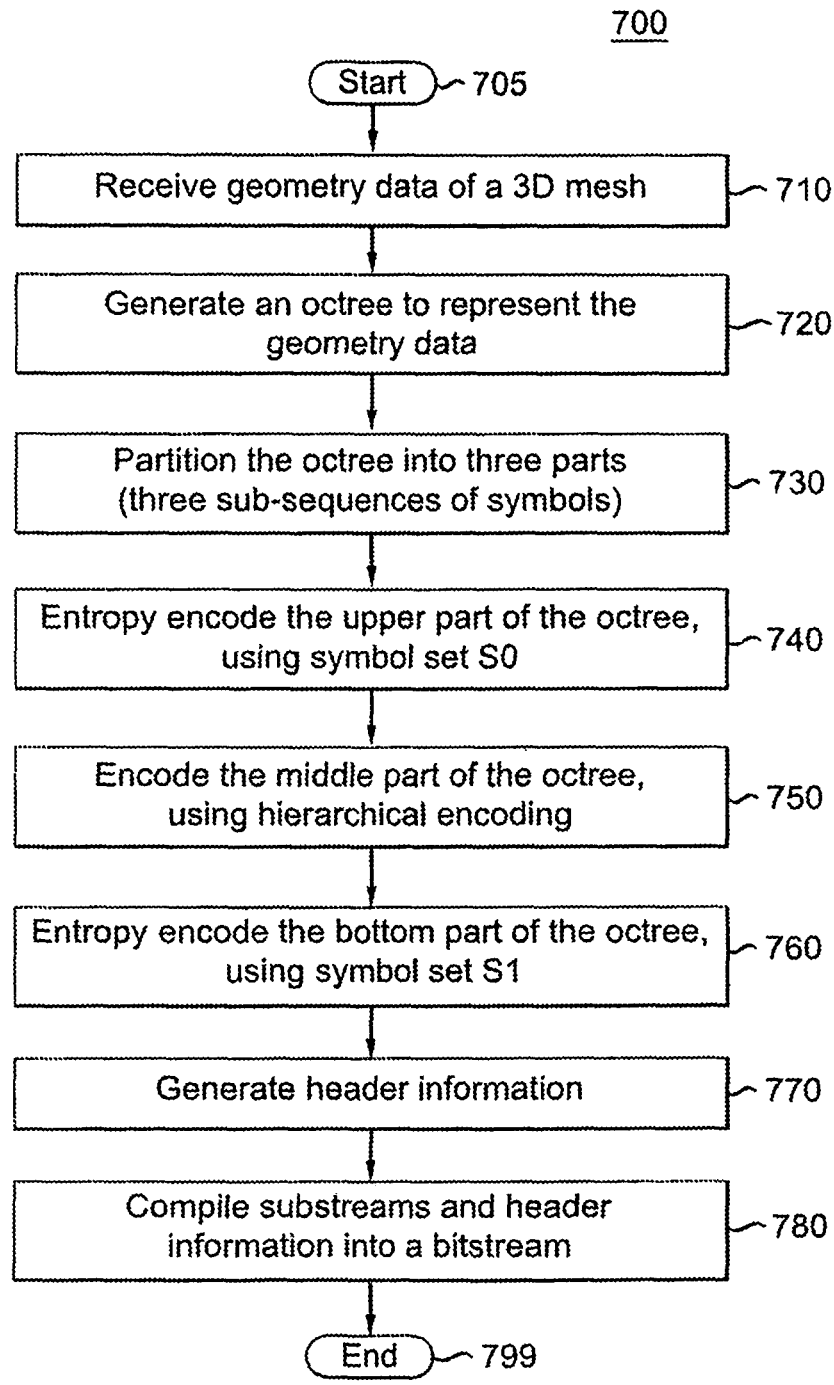
FIG. 7 is a flow diagram depicting an example for compressing geometry data of a 3D mesh, in accordance with an embodiment of the present principles.

FIG. 7 illustrates an exemplary method 700 for compressing geometry data of a 3D mesh. In this method, the geometry data is represented by an octree. The octree is first partitioned into three parts: P0, P1, and P2, and three symbol sets: S0, S1, and S2 are defined. Each part of the tree is efficiently compressed with an appropriate statistical model. In this example, S1 is a subset of S0, and S2 is a union of S1 and a pre-determined symbol 'X', that is, S2={S1, 'X'}. In other embodiments, S0 and S1 may contain other symbols, and S2 may be in other relations with S1. Three substreams are formed by entropy coding each of the parts. A bitstream may then be generated by combining the three substreams with other information, for example, supplemental information to enable proper decoding.

Method 700 includes a start block 705 that passes control to a function block 710. In block 710 geometry data of a 3D mesh is received and in block 720 an octree is generated to represent the geometry data. The octree may be regarded as a complete sequence of symbols corresponding to the received geometry data. In block 730 the octree is partitioned into three parts: upper part P0, bottom part P1, and middle part P2. Each part corresponds to a sub-sequence. Consequently, the complete sequence of symbols is divided into three sub-sequences.

The sub-sequences are then entropy encoded. In block 740 the sub-sequence corresponding to the upper part is entropy encoded using symbol set S0; in block 750 the sub-sequence corresponding to the middle part is entropy encoded using hierarchical entropy encoding; and in block 760 the bottom part is entropy encoded, using symbol set S1 and its statistical model. In block 770 the header information is generated. The substreams and header information are combined and compiled into a bitstream in block 780. Control is then passed to end block 799.

In method 700, the sub-sequence of symbols for the upper part is encoded before that for the middle and bottom part. Other orders of encoding can also be used.

Figure 8:
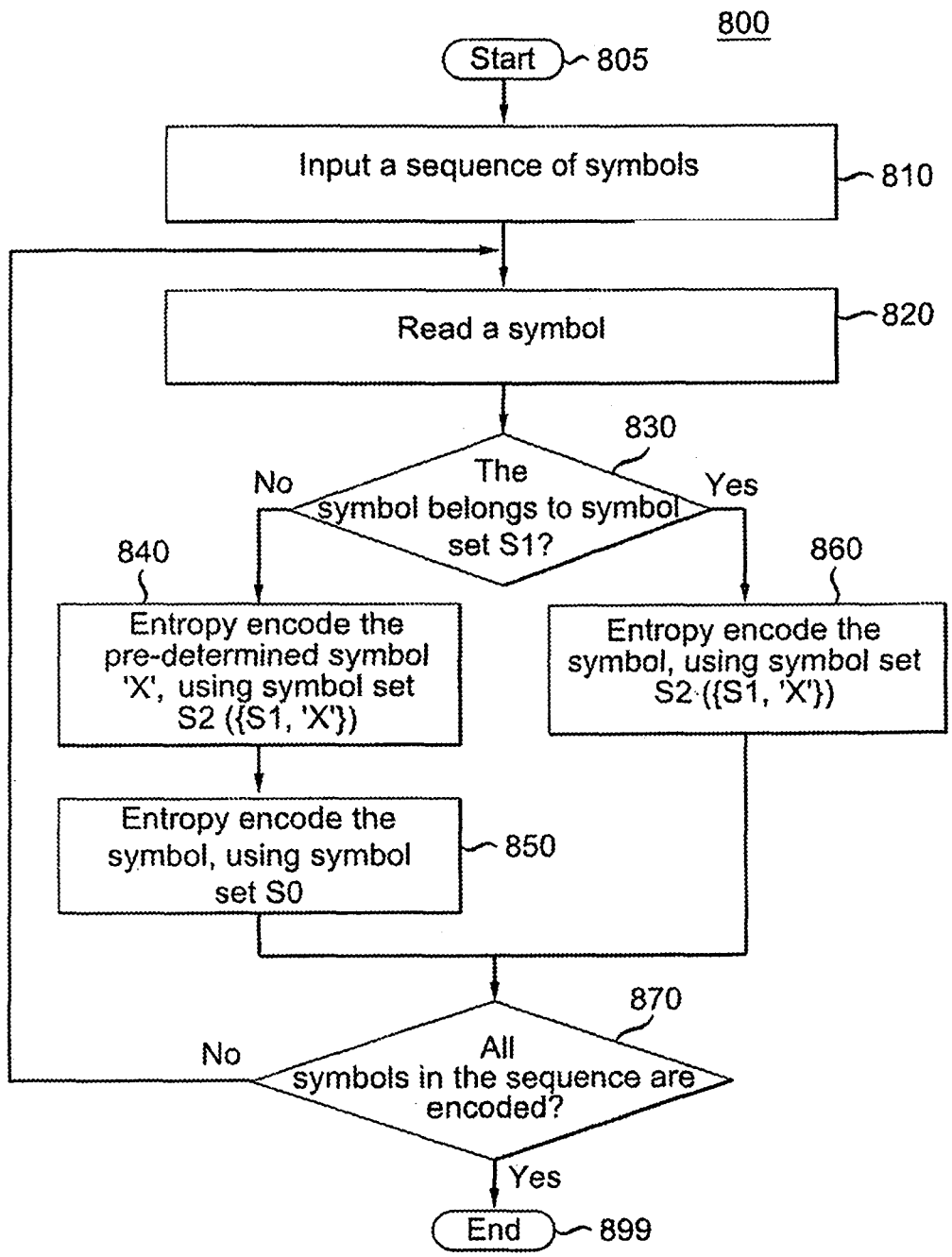
FIG. 8 is a flow diagram depicting an example for hierarchical entropy encoding, in accordance with an embodiment of the present principles.

An exemplary hierarchical entropy encoding method to encode an input sequence of symbols to output a bitstream, which may be used in block 750, is depicted in FIG. 8 as method 800. In one example, the sequence of symbols corresponds to the sub-sequence for the middle part of the octree. In another embodiment, the sequence of symbols may be generated from other sources, for example, a set of 2D coordinates represented by a quadtree.

Method 800 includes a start block 805 that passes control to a function block 810. In block 810 a sequence of symbols is received as an input. In block 820 a symbol is read from the sequence of symbols. In block 830 it is determined whether the symbol belongs to symbol set S1. If the symbol does not belong to S1, a pre-determined symbol 'X' is first entropy encoded using symbol set S2 (S2={S1, 'X'}) in block 840, and the symbol itself is then entropy encoded in block 850, but using symbol set S0 (S0 ⊃ S1). If the symbol belongs to S1, it is entropy encoded using symbol set S2 ({S1, 'X'}) in block 860. In block 870 it is checked whether all symbols in the sequence are encoded. If all symbols are encoded, control is passed to an end block 899; otherwise, it is returned to block 820.

Symbol set S2 includes a pre-determined symbol 'X' in addition to symbol set S1. Using a smaller symbol set S1 and an additional symbol, instead of the complete symbol set S0, the S1 symbols in the middle part of the octree may be encoded more efficiently. Each non-S1 symbols is first represented as 'X' and entropy encoded as 'X', followed by entropy coding of the symbol itself. That is, symbol 'X' can be regarded as a collection of non-S1 symbols. Therefore, the entropy encoding method described in FIG. 8 and its corresponding decoding method are referred to as hierarchical entropy encoding/decoding.

While the above discussions mainly focus on compressing geometry data of a 3D mesh, such a hierarchical entropy encoding/decoding method can also be applied to any sequence of data which have different statistics in different portions of the sequence. In particular, some portions may be encoded with pre-defined symbol sets, and other portions may be encoded by introducing pre-determined symbols into the pre-defined symbols. The advantage of this method is that only a few symbols sets are required, and thus, reducing the overhead in indicating when to switch symbols sets. Additionally, using a small symbol set (i.e., a small pre-defined symbol set and a pre-determined symbol, instead of a complete symbol set) for frequently occurring symbols may improve the compression efficiency.

According to the present principles, it is desired to properly partition the octree to enable efficient encoding of the geometry data. In one embodiment, a principle is to have bottom part P1 as large as possible and to limit the occurrence of non-S1 symbols in middle part P2 and bottom part P1.
Partition P1 and P2

Since symbol set S2 contains one more symbol, 'X', than symbol set S1, the compression efficiency of middle part P2 is lower than that of P1. Thus, a large P1, which can be efficiently encoded by S1, is desired to obtain a high coding efficiency. To make P1 as large as possible, non-S1 symbols are also allowed in P1.

While S1 symbols are compressed by symbol set S1, non-S1 symbols are compressed with symbol set S0. To indicate the location of a non-S1 symbol, the layer index and the position within the layer of a non-S1 symbol are written into the bitstream. Encoding of non-S1 symbols is costly since both the symbols and their locations need to be encoded. Thus, the number of non-S1 symbols in P1 should be limited.

To reach a balance between the size of P1 and the number of non-S1 symbols in P1, a threshold based method is used. In this method, we define the symbol sequence obtained by breadth-first traversal of the octree as SEQ_BF. We then search for non-S1 symbols from the end of SEQ_BF, and stop search when a non-S1 symbol is found and a distance between this non-S1 symbol and a previously found non-S1 symbol is smaller than th1. All layers below this non-S1 symbol are part of P1. The index of the top layer of bottom part P1 is written into the bitstream to indicate how the octree is partitioned to obtain P1.
Partition P0 and P2

Another threshold is used to separate upper part P0 from middle part P2. To determine the partition, we first scan SEQ_BF from the beginning layer by layer, each layer containing more than th0% non-S1 symbols is included into an initial upper part P0, where th0 is a pre-defined threshold. The scanning stops when it reaches a layer containing less than th0% non-S1 symbols. The layer at where the scanning stops and layers above it form initial upper part P0. Layers excluding bottom part P1 and initial P0 form initial middle part P2. Note that some layers in initial P2 may also contain more than th0% non-S1 symbols.

A node associated with an S1 symbol is defined as an S1 node, and otherwise as a non-S1 node. The set of terminal nodes (i.e., leaves) of upper part P0 is defined as the lower boundary of P0. For example, the lower boundary of the initial P0 is the lowest layer of nodes in the initial P0. The separation of P0 and P2 is then recursively refined using the lower boundary of P0: the children of non-S1 nodes are included in P0 and the children of S1 nodes are included in P2. Note symbols from the bottom part P1 should not become part of P0 or P2.

Figure 9:
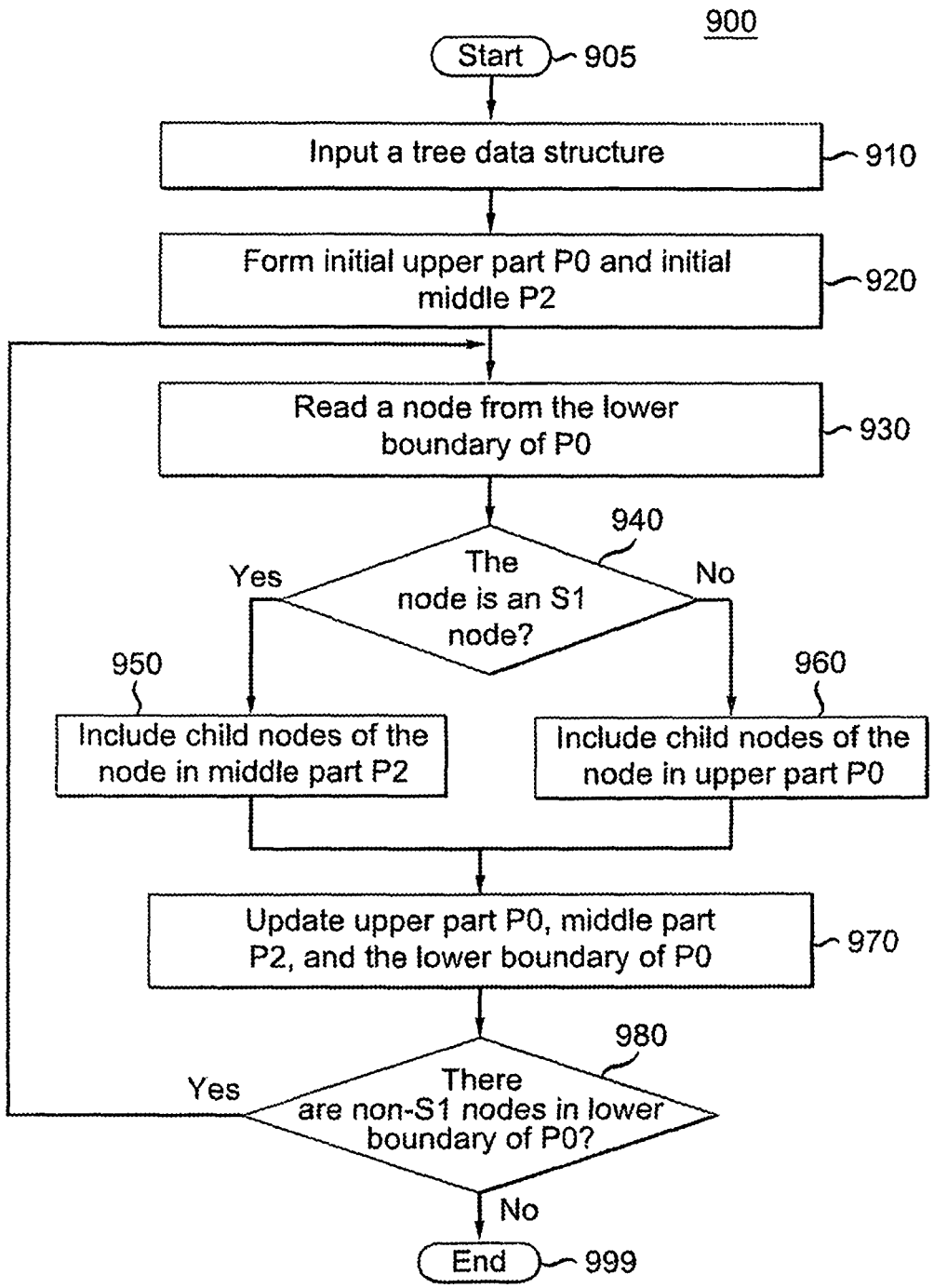
FIG. 9 is a flow diagram depicting an example for partitioning a tree data structure, in accordance with an embodiment of the present principles.

Turning to FIG. 9, an example depicting how P0 is separated from P2 is generally shown as method 900. Method 900 starts with block 905 that passes control to a function block 910. In block 910 a tree data structure is received as an input. In this example, the tree data structure corresponds to the octree excluding bottom part P1. Other tree data structures, such as the binary tree in FIG. 6, can also be input for partitioning. Using threshold th0, an initial upper part P0 and initial middle part P2 are formed in block 920. In block 930 a node is read from the lower boundary of P0. In block 940 it is checked whether the node is an S1 node. If the node is an S1 node, in block 950 its child nodes are included in middle part P2; otherwise, in block 960 its child nodes are included in upper part P0. Upper part P0, middle part P2, and the lower boundary of P0 are then updated in block 970. In block 980 it is checked whether there are non-S1 nodes in the lower boundary of P0. If there are non-S1 nodes, control is returned to block 930; otherwise, control is passed to end block 999.

As previously discussed, S1 nodes usually consist of more than 90% of the nodes in the octree. Thus, in an extreme case, all the nodes excluding bottom part P1 can be encoded with symbol set S2, and no separation between P0 and P2 is needed. However, this may result in a large quantity of 'X's, causing the encoding to be less efficient. In general, since non-S1 nodes occur much more frequently in upper layers of the octree, it is more efficient to separate P0 out and to encode P0 with symbol set S0.

Regarding the pre-defined thresholds, they may be determined by the type of vertex positions to be coded. In one example, th0=15 and th1=50 are used for the compression of sparse point positions. In another example, th0=10 and th1=200 are used for watertight vertices obtained from certain 3D models.

In the previous example, symbol set S2 is a union of symbol set S1 and 'X', that is, S2 contains merely one more symbol than S1. In other embodiments, S2 may take other forms. For example, when certain non-S1 symbols occur at high probabilities in P2, they can be included in S2. In one embodiment, the symbols having two '1's in binary representations occur more frequently than those having more and thus, these symbols are also included in S2. Consequently, S2 becomes {3, 5, 9, 17, 33, 65, 129, 6, 10, 18, 34, 66, 130, 12, 20, 36, 68, 132, 24, 40, 72, 136, 48, 80, 144, 96, 160, 192, 1, 2, 4, 8, 16, 32, 64, 128, X} and it contains 8+28+1=37 symbols.

After the octree is partitioned into three parts, the corresponding sub-sequences are compressed. Initial statistical models of symbol sets S0, S1 and S2 are provided to the codec as inputs. During encoding and decoding processes, the statistical models are further updated for better compression efficiency.

A large quantity of vertex data is used to train the statistical models. Three data sets are constructed for P0, P1 and P2 respectively to gather statistics for corresponding symbol sets. Note that all non-S1 symbols in P2 are regarded as 'X' during the statistical modeling process for S2.

In the present embodiments, three substreams: substreams 1, 2, and 3, are generated. Depending on how the substreams are organized, a substream may correspond to a sub-sequence or an entropy coding engine with a particular symbol set. The number of substreams may be more than three in other embodiments, for example, when a separate bitstream is generate for each combination of sub-sequence and symbol set.

In our embodiment, arithmetic coding is used for entropy coding. Other entropy coding methods, for example, Huffman coding and dictionary-based compression can also be used.

To enable a receiving side to decode the substreams properly, supplemental information is written into the bitstream in addition to the substreams. FIG. 10A illustrates an exemplary bitstream format. The exemplary bitstream consists of header 1010, substream 1 (1020), substream 2 (1030), and substream 3 (1040). Header 1010 is further illustrated in FIG. 10B. The format of supplemental information in the header provides information as to how bottom part P1 is separated from middle part P2, using the index of P1's top layer ("layer_index," 1050). To indicate the locations of non-S1 symbols in bottom part P1, the header provides the number of non-S1 symbols in P1 ("No_non_S1," 1060) followed by their locations ("location_non_S1$_i$," 1070 and 1075). The header also provides lengths of substream 1 ("len_substream1," 1080) and substream 2 ("len_substream2," 1090).

Figure 11:
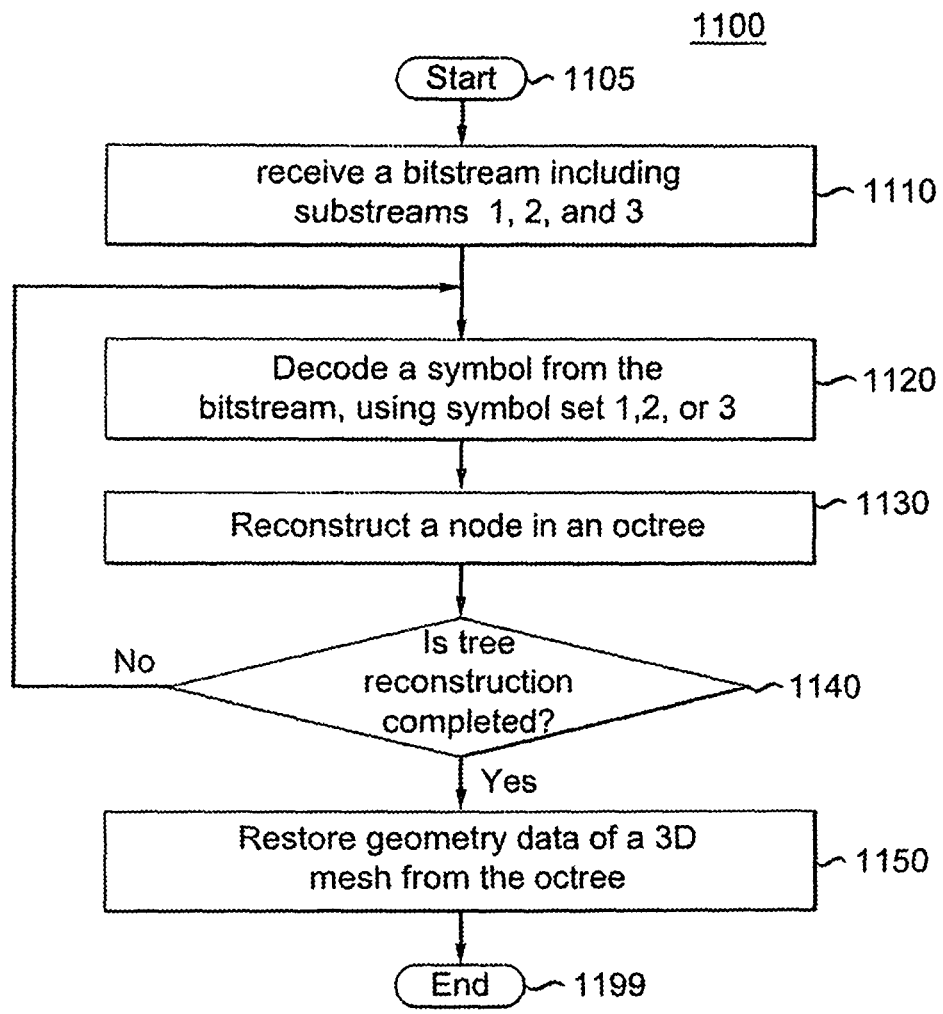
FIG. 11 is a flow diagram depicting an example for entropy decoding a bitstream and restoring geometry data of a 3D mesh, in accordance with an embodiment of the present principles.

In FIG. 11, an exemplary method 1100 for decoding a generated bitstream and reconstructing an octree is shown. The octree is constructed as the entropy decoding proceeds. A node in the octree is constructed after a symbol is decoded except when the pre-determined symbol 'X' is decoded. Symbols in upper part P0 are decoded using symbol set S0. Symbols in middle part P2 are first decoded using symbol set S2. When an 'X' is decoded, an additional symbol is decoded using S0 to reconstruct the node, that is, no node is constructed corresponding to 'X'. Non-S1 symbols in bottom part P1 are decoded using symbol set S0 and their locations are known from the header. Other symbols, i.e., S1 symbols in P1 are decoded using symbol set S1.

Method 1100 starts with a start block 1105 that passes control to a function block 1110. In block 1110 the bitstream is received. In block 1120 a symbol is decoded from the bitstream. In block 1130 a node of the octree is reconstructed when a non 'X' symbol is decoded. In block 1140 it is checked whether the octree is completely reconstructed, i.e., whether the octree construction no longer requests more symbols. If the tree is not completed, control is returned to block 1120. Otherwise, in block 1150 geometry data of a 3D mesh is restored and control is passed to end block 1199.

Figure 12:
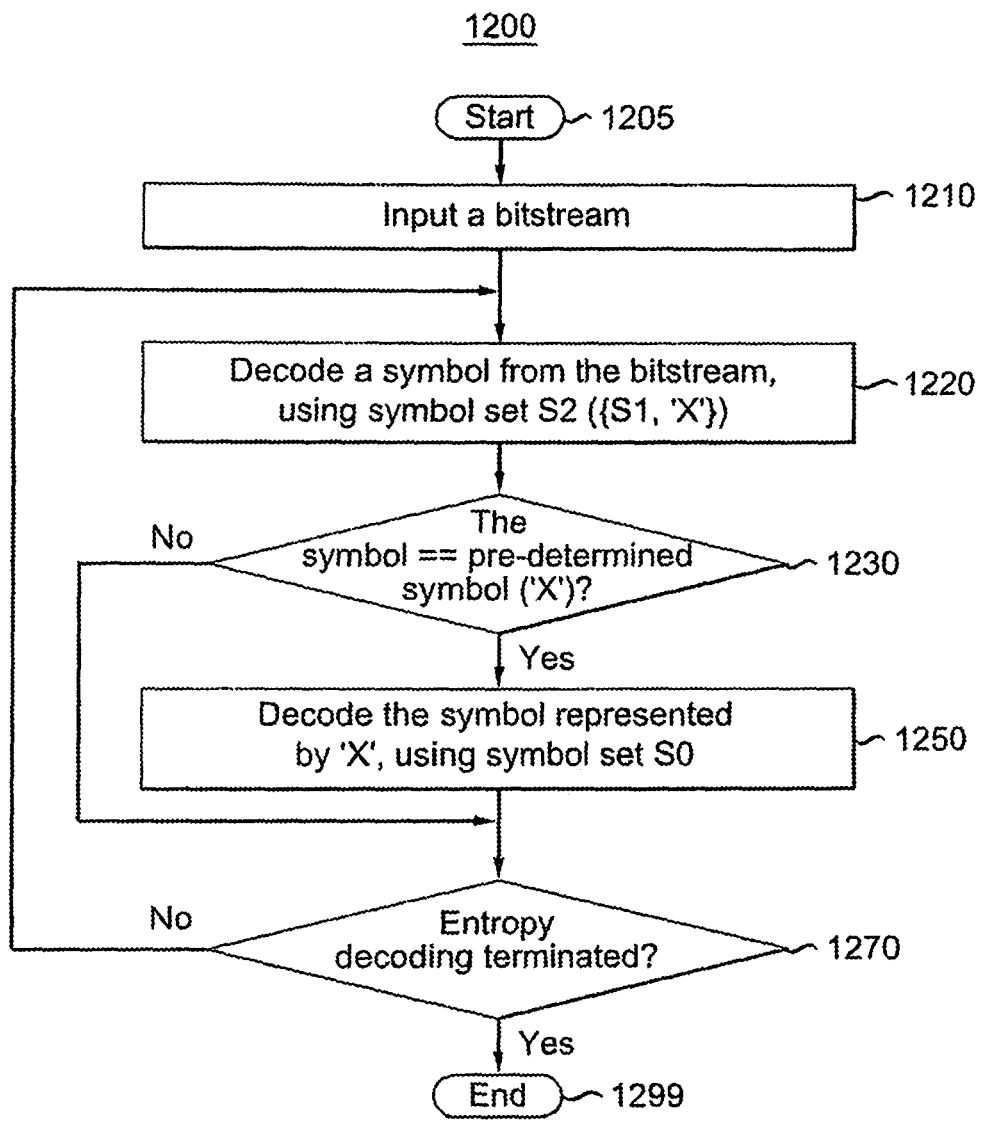
FIG. 12 is a flow diagram depicting an example for hierarchical entropy decoding, in accordance with an embodiment of the present principles.

An exemplary hierarchical entropy decoding method 1200 to decode an input bitstream to output a decoded sequence is depicted in FIG. 12. Method 1200 starts with a start block 1205 that passes control to a function block 1210 wherein a bitstream is received. In block 1220 a symbol is decoded from the bitstream, using a statistical model for S2={S1, 'X'}. In block 1230 it is checked whether the decoded symbol is the pre-determined symbol 'X'. If the decoded symbol is not the pre-determined symbol 'X', i.e., it is an S1 symbol, control is passed to block 1270. Otherwise, in block 1250 another symbol is decoded from the bitstream, using S0.

In block 1270 it is checked whether the entropy decoding process should be terminated. In one embodiment, when the middle part of the octree is completely constructed, the entropy decoding process ends. In other embodiments, it can check whether the entropy decoder reaches a terminal symbol. If entropy decoding should be terminated, control is passed to end block 1299. Otherwise, control is returned to block 1220.

Figure 13:
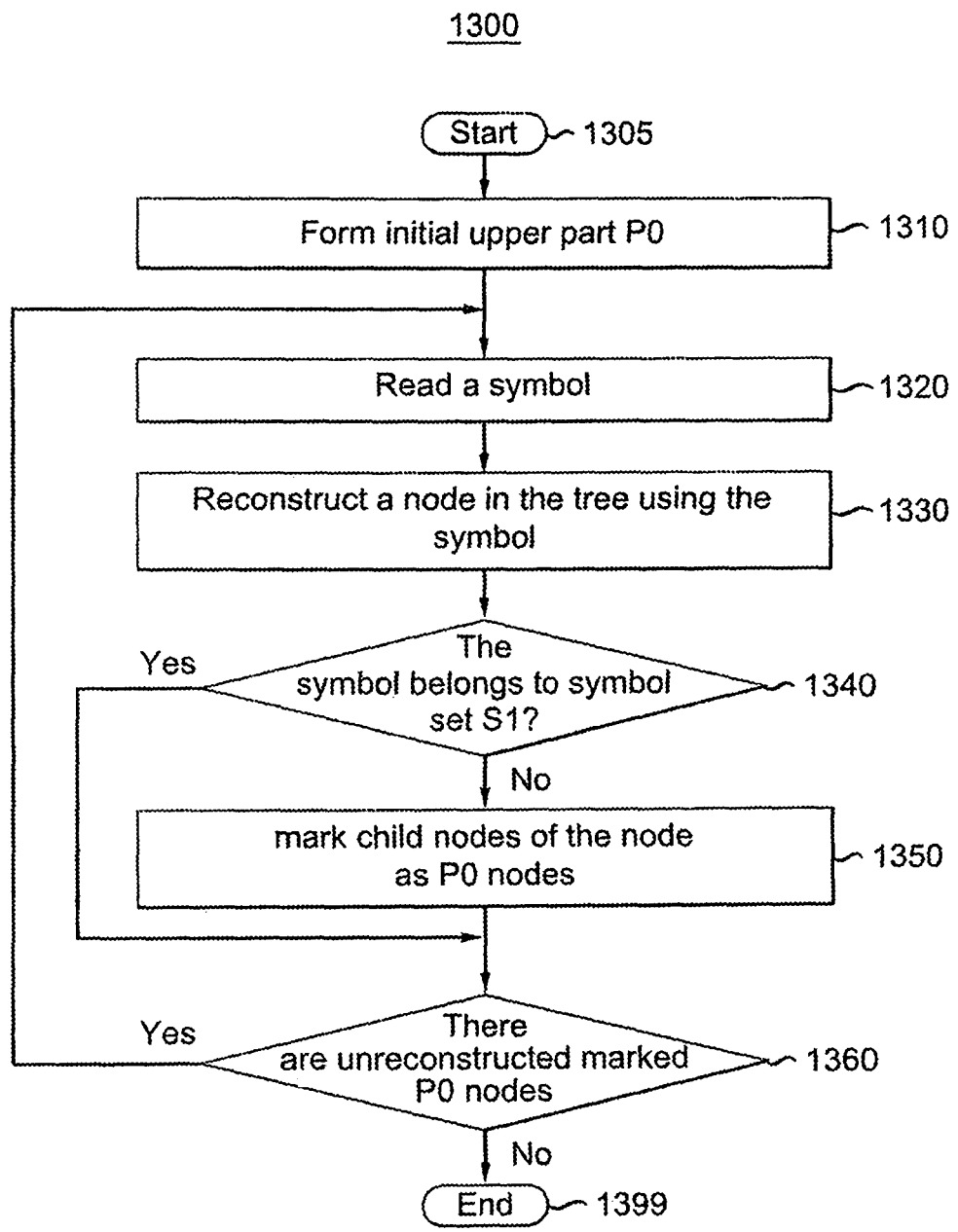
FIG. 13 is a flow diagram depicting an example for reconstructing a tree data structure, in accordance with an embodiment of the present principles.

FIG. 13 illustrates an exemplary method 1300 for reconstructing the upper part of the tree. Consistent with tree partition, breadth-first traversal is used to reconstruct the octree. Whenever a layer in P0 is constructed, the percentage of non-S1 symbols is calculated. Scanning layer by layer from the root of the tree, the first layer with a percentage of non-S1 symbols smaller than th0% and layers above it form the initial upper part P0. Note this is consistent with how the initial upper part P0 and P2 are formed as described in FIG. 9.

Method 1300 starts with a start block 1305 and passes control to a function block 1310 wherein the initial upper part P0 is formed. In block 1320 a symbol is read from the bitstream and in block 1330 a node is reconstructed in the tree using the symbol. In block 1340 it is checked whether the symbol belongs to symbol set S1. If it belongs to S1, control is passed to block 1360. Otherwise, in block 1350 child nodes of the node are marked as P0 nodes. In block 1360 it is checked whether there are any marked P0 nodes that are not yet reconstructed. If there are no more reconstructed P0 nodes, control is passed to end block 1399. Otherwise, control is returned to block 1320.

Figure 14A:
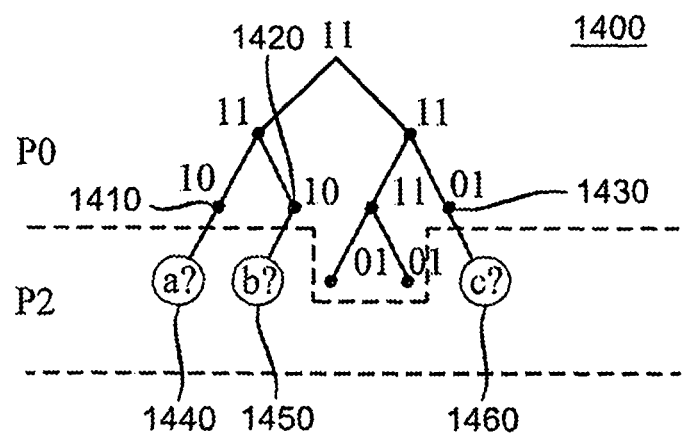
FIG. 14 is a pictorial representation depicting an example for reconstructing a tree data structure.
Figure 14B:
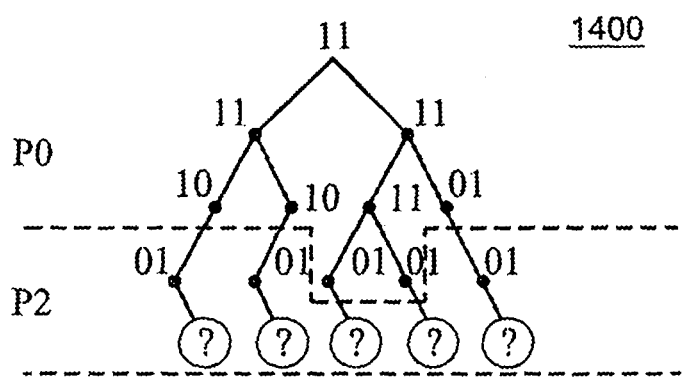

After P0 is reconstructed, P2 is reconstructed in one exemplary embodiment as shown in FIG. 14 as method 1400. From the symbols for the terminal nodes in P0, the tree continues its reconstruction. Since symbol '10' for node 1410 represents that it has only a left child node, the first symbol in P2 is reconstructed as a left child node 1440 of node 1410. Similarly, the next two symbols in P2 are reconstructed as a left child node 1450 of node 1420 and a right child node 1460 of node 1430. After the first layer in P2 is completed, the remaining layers of the tree are reconstructed.

Given P1's top layer index, it can be known when the construction of P2 is completed. P1 is reconstructed after P2 is completed.

FIG. 6 illustrates by an example in a reduced dimension the operation of the present principles. For easier understanding, FIG. 6 describes how symbols represented by a binary tree are divided into three sub-sequences and how corresponding symbol sets are used for entropy coding. For simplicity, in this embodiment, P1 does not contain any non-S1 symbols; and threshold th0 is not considered when forming P0. In the following, the encoding and decoding processes for this binary tree are described in details.

Encoding Process

First we access the nodes by breadth-first traversal from the end and locate the layer containing the last non-S1 node (670). All nodes below this layer (below line 650) are part of P1. P1's top layer index is compressed by fixed-length coding. Sub-sequence 640, formed by breadst-first traversal of the nodes in P1, is compressed with symbol set S1 into substream 3.

The remaining nodes in the octree are further partitioned into P0 and P2. For simplicity, threshold th0 is not considered in separating P0 from P2, that is, it is not mandated that the top few layers must be included in P0. Then we access the nodes by breadth-first traversal from the root. When reaching a node with a non-S1 symbol, its children and the symbol itself are included in P0; otherwise the node itself is included in P0 but its children are included in P2. The traversal stops when all the nodes in the octree are processed. Note that nodes from P1 should not be included in P0 or P2. Sub-sequence 620 obtained by breadth-first traversal of P0 is compressed into substream 1.

Another sub-sequence 630 is formed by breadth-first traversal of the nodes in P2. Symbols from P2 are encoded into substream 2.

In the example of FIG. 6, the partitioned and reordered sub-sequences are as follows:
  sub-sequence for P0: 11, 11, 11, 10, 10, 11, 01, 01, 01;
  sub-sequence for P2: 01, 01, 01, 10, 11, 01, 01, 01; and
  sub-sequence for P1: 10, 10, 10, 10, 01, 01, 01, 01, 01, 01, 10, 10.

Sub-sequences from P0 and P1 are encoded with conventional entropy encoding into substreams 1 and 3 respectively. For the sub-sequence from P2, S1 symbols and non-S1 symbols are encoded differently. In this example, there is only one non-S1 symbol ('11', 670) in P2. To encode this symbol, 'X' is first encoded using S2={S1, 'X'}. The symbol itself ('11') is then encoded using S0. Remaining S1 symbols are encoded using S2. Therefore, one additional symbol is encoded for P2.

In this example, the encoding result of a sub-sequence is organized into a substream. Thus, symbols for P0, P2, and P1 are encoded into substreams 1, 2, and 3 respectively, as follows:
  symbols in substream 1: 11, 11, 11, 10, 10, 11, 01, 01, 0
  symbols in substream 2: 01, 01, 01, 10, 'X', 11, 01, 01, 01;
  symbols in substream 3: 10, 10, 10, 10, 01, 01, 01, 01, 01, 01, 10, 10.

Decoding Process

First we decode layer_index that indicates the top layer index of P1. According to the present principles we decode symbols from substream 1 and reconstruct the upper part of the tree by breadth-first traversal. When reaching an S1 node, reconstruction of its child nodes are skipped. The traversal terminates when all P0 nodes are reconstructed.

Next, we decode symbols from substream 2 and continue reconstructing the tree by breadth-first traversal. When obtaining symbol 'X', we decode an additional symbol with symbol set S0 as the actual symbol of the node. The traversal terminates when the number of layers in P0 and P2 reaches the number indicated by layer_index.

Next, we decode symbols from substream 3 and continue reconstructing the tree by breadth-first traversal.

Figure 15:
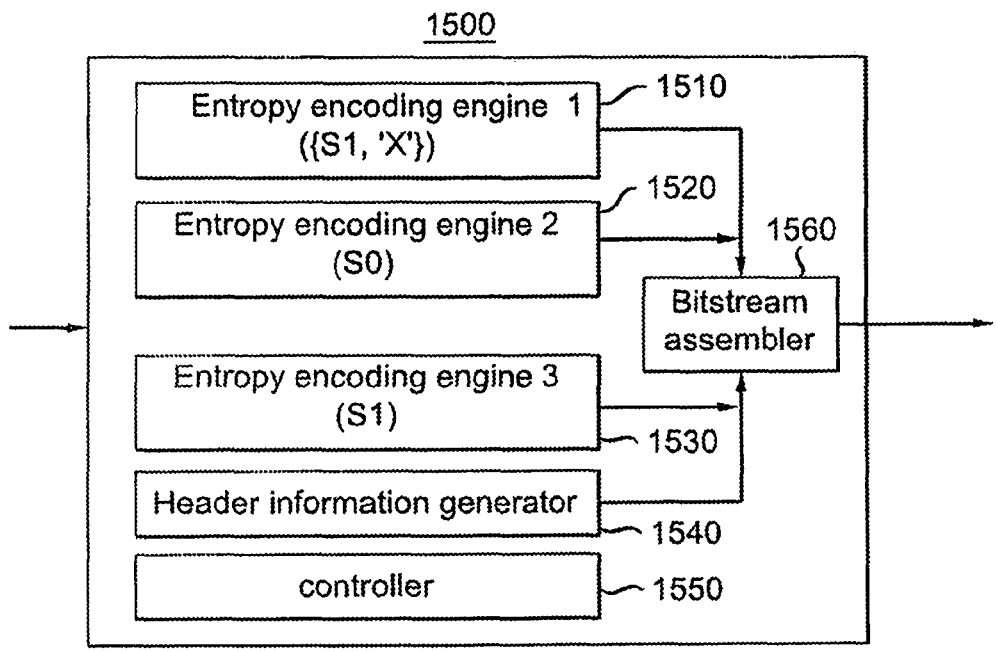
FIG. 15 is a block diagram depicting an example of an encoder that may be used with one or more implementations.

FIG. 15 depicts a block diagram of an exemplary encoder that can be used to form the bitstream described in FIG. 10. The input of encoder 1500 includes the sequence of symbols and the layer index of P1's top layer. Entropy encoding engine 1 (1510) encodes symbols using S2={S1, 'X'}. Entropy encoding engine 2 (1520) encodes using symbol set S0, and entropy encoding engine 3 (1530) encodes using symbol set S1.

All entropy encoding engines start with respective initial statistical models. As discussed before, the initial statistical models can be trained from large data sets. As the entropy encoding engines proceeds with encoding, the statistical models are usually updated to better capture the statistical property of the input data. Three separate entropy encoding engines are discussed in the exemplary encoder. In practical implementations, these engines may be implemented as one single engine switching between various statistical models.

Header information generator 1540 provides supplemental information for the bitstream. It encodes the layer index of the P1's top layer and the lengths of substreams 1 and 2. When there are non-S1 symbols in bottom part P1, their locations are also encoded into the header. Other information that is required to decode the sequence should also be included in the header. Thresholds used to partition the octree, for example, th0 and th1, may be adaptive to the 3D mesh and may vary from bitstream to bitstream. To synchronize the encoder and decoder, such adaptive thresholds need to be embedded in the header.

Encoder 1500 also includes a controller (1550) for performing functions such as determining which entropy encoding engine will be used for a symbol. The encoded bits and the header information are packed, for example, according to a format described in FIG. 10, by a bitstream assembler 1560 into an output bitstream. Although the details of the interconnections between the various elements are not explicitly shown in FIG. 15, the required interconnections are understood by those skilled in the art.

Figure 16:
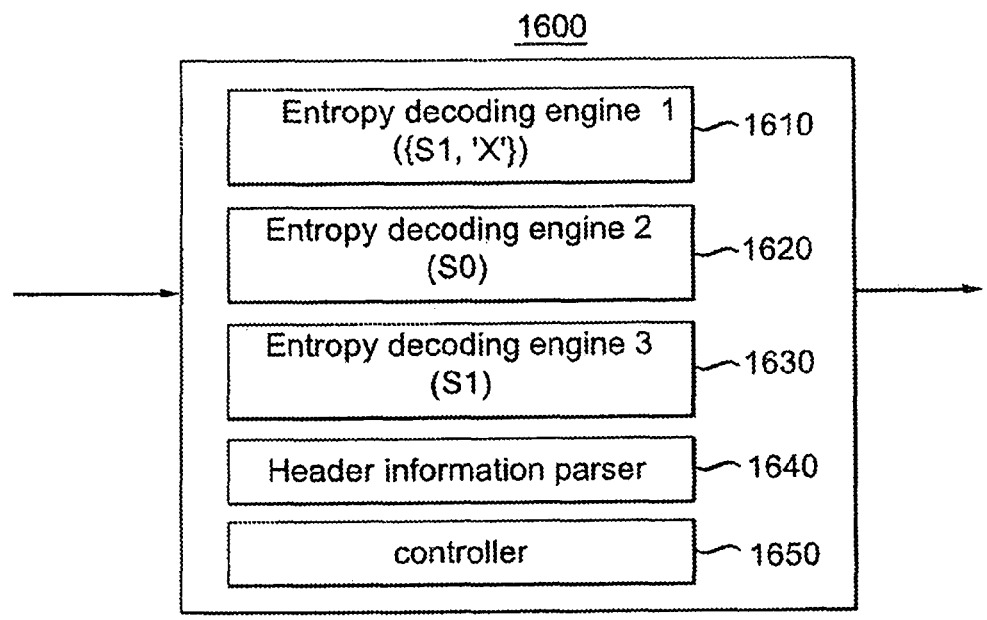
FIG. 16 is a block diagram depicting an example of a decoder that may be used with one or more implementations.

FIG. 16 depicts a block diagram of an exemplary decoder corresponding to encoder 1500 of FIG. 15, which can be used to decode the bitstream described in FIG. 10. Note the decoder is usually reciprocal to the encoder. Entropy decoding engine 1 (1610) decodes symbols that are encoded by entropy encoding engine 1, using symbol set S2 ({S1, 'X'}). Entropy decoding engine 2 (1620) decodes symbols that are encoded by entropy encoding engine 2, using symbol set S0. Entropy decoding engine 3 (1630) decodes symbols that are encoded by entropy encoding engine 3, using symbol set S1 and its associated statistical model. Header information parser 1640 decodes supplemental information.

Decoder 1600 also includes a controller (1650) for performing functions such as determining which entropy decoding engine will be used for decoding a symbol. Decoder 1600 provides a sequence of symbols and other information, for example, lengths of substreams as its output. Again, the required interconnections between the elements of the decoder are understood by those skilled in the art.

Figure 17:
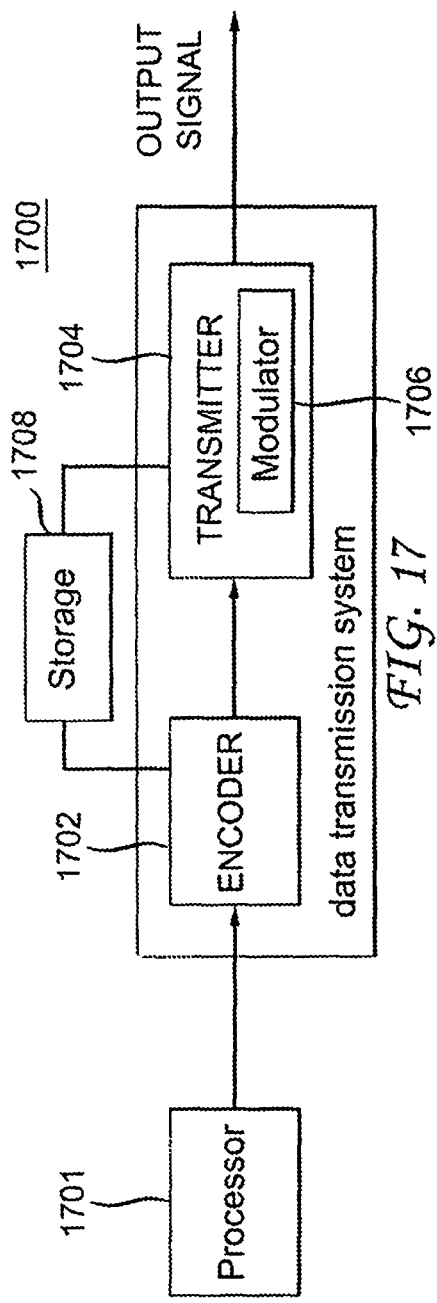
FIG. 17 is a block diagram depicting an example of a data processing system that may be used with one or more implementations.

Referring now to FIG. 17, a data transmission system or apparatus 1700 is shown, to which the features and principles described above may be applied. The data transmission system or apparatus 1700 may be, for example, a head-end or transmission system for transmitting a signal using any of a variety of media, such as, for example, satellite, cable, telephone-line, or terrestrial broadcast. The data transmission system or apparatus 1700 also, or alternatively, may be used, for example, to provide a signal for storage. The transmission may be provided over the Internet or some other network. The data transmission system or apparatus 1700 is capable of generating and delivering, for example, video content and other content such as, for example, 3D mesh models.

The data transmission system or apparatus 1700 receives processed data and other information from a processor 1701. In one implementation, the processor 1701 processes geometry data of 3D mesh models to generate sequences of symbols. The processor 1701 may also provide metadata to 1700 indicating, for example, how a tree data structure is divided into three parts, the adaptive thresholds, and locations of non-S1 symbols in part P1.

The data transmission system or apparatus 1700 includes an encoder 1702 and a transmitter 1704 capable of transmitting the encoded signal. The encoder 1702 receives data information from the processor 1701. The encoder 1702 generates an encoded signal(s). The entropy encoding engine of encoder 1702 may be, for example, arithmetic coding or Huffman coding.

The encoder 1702 may include sub-modules, including for example an assembly unit for receiving and assembling various pieces of information into a structured format for storage or transmission. The various pieces of information may include, for example, coded or uncoded video, and coded or uncoded elements such as, for example, substream length indicator, and syntax elements. In some implementations, the encoder 1702 includes the processor 1701 and therefore performs the operations of the processor 1701.

The transmitter 1704 receives the encoded signal(s) from the encoder 1702 and transmits the encoded signal(s) in one or more output signals. The transmitter 1704 may be, for example, adapted to transmit a program signal having one or more bitstreams representing encoded pictures and/or information related thereto. Typical transmitters perform functions such as, for example, one or more of providing error-correction coding, interleaving the data in the signal, randomizing the energy in the signal, and modulating the signal onto one or more carriers using a modulator 1706. The transmitter 1704 may include, or interface with, an antenna (not shown). Further, implementations of the transmitter 1704 may be limited to the modulator 1706.

The data transmission system or apparatus 1700 is also communicatively coupled to a storage unit 1708. In one implementation, the storage unit 1708 is coupled to the encoder 1702, and stores an encoded bitstream from the encoder 1702. In another implementation, the storage unit 1708 is coupled to the transmitter 1704, and stores a bitstream from the transmitter 1704. The bitstream from the transmitter 1704 may include, for example, one or more encoded bitstreams that have been further processed by the transmitter 1704. The storage unit 1708 is, in different implementations, one or more of a standard DVD, a Blu-Ray disc, a hard drive, or some other storage device.

Figure 18:
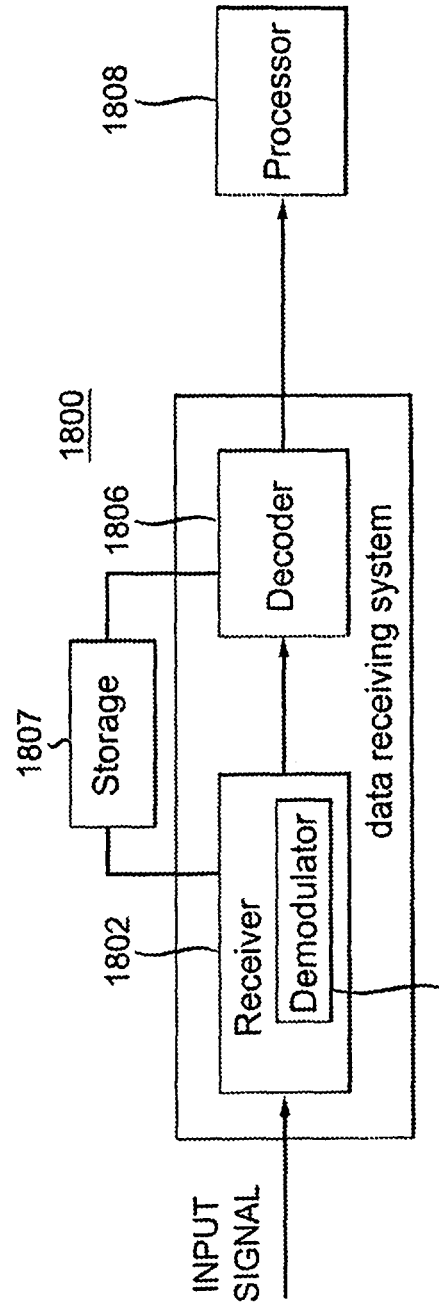
FIG. 18 is a block diagram depicting another example of a data processing system that may be used with one or more implementations.

Referring now to FIG. 18, a data receiving system or apparatus 1800 is shown to which the features and principles described above may be applied. The data receiving system or apparatus 1800 may be configured to receive signals over a variety of media, such as, for example, storage device, satellite, cable, telephone-line, or terrestrial broadcast. The signals may be received over the Internet or some other network.

The data receiving system or apparatus 1800 may be, for example, a cell-phone, a computer, a set-top box, a television, or other device that receives encoded video and provides, for example, decoded video signal for display (display to a user, for example), for processing, or for storage. Thus, the data receiving system or apparatus 1800 may provide its output to, for example, a screen of a television, a computer monitor, a computer (for storage, processing, or display), or some other storage, processing, or display device.

The data receiving system or apparatus 1800 is capable of receiving and processing data information, and the data information may include, for example, 3D mesh models. The data receiving system or apparatus 1800 includes a receiver 1802 for receiving an encoded signal, such as, for example, the signals described in the implementations of this application. The receiver 1802 may receive, for example, a signal providing one or more of the 3D mesh models and/or texture images, or a signal output from the data transmission system 1700 of FIG. 17.

The receiver 1802 may be, for example, adapted to receive a program signal having a plurality of bitstreams representing encoded pictures. Typical receivers perform functions such as, for example, one or more of receiving a modulated and encoded data signal, demodulating the data signal from one or more carriers using a demodulator 1804, de-randomizing the energy in the signal, de-interleaving the data in the signal, and error-correction decoding the signal. The receiver 1802 may include, or interface with, an antenna (not shown). Implementations of the receiver 1802 may be limited to the demodulator 1804.

The data receiving system or apparatus 1800 includes a decoder 1806. The receiver 1802 provides a received signal to the decoder 1806. The signal provided to the decoder 1806 by the receiver 1802 may include one or more encoded bitstreams. The decoder 1806 outputs a decoded signal, such as, for example, decoded video signals including video information. The decoder 1806 may be, for example, decoder 1600 described in FIG. 16.

The data receiving system or apparatus 1800 is also communicatively coupled to a storage unit 1807. In one implementation, the storage unit 1807 is coupled to the receiver 1802, and the receiver 1802 accesses a bitstream from the storage unit 1807. In another implementation, the storage unit 1807 is coupled to the decoder 1806, and the decoder 1806 accesses a bitstream from the storage unit 1807. The bitstream accessed from the storage unit 1807 includes, in different implementations, one or more encoded bitstreams. The storage unit 1807 is, in different implementations, one or more of a standard DVD, a Blu-Ray disc, a hard drive, or some other storage device.

The output data from the decoder 1806 is provided, in one implementation, to a processor 1808. The processor 1808 is, in one implementation, a processor configured for performing 3D mesh model reconstruction. In some implementations, the decoder 1806 includes the processor 1808 and therefore performs the operations of the processor 1808. In other implementations, the processor 1808 is part of a downstream device such as, for example, a set-top box or a television.

We thus provide one or more implementations having particular features and aspects. In particular, we provide several implementations relating to entropy encoding and decoding. Hierarchical entropy encoding and decoding may allow a variety of applications, such as, for example, compression of geometry data of a 3D mesh, random 2D coordinates, and any data source with varying statistics. However, variations of these implementations and additional applications are contemplated and within our disclosure, and features and aspects of described implementations may be adapted for other implementations.

Several of the implementations and features described in this application may be used in the context of the MPEG 3DGC Standard and its extensions. Additionally, these implementations and features may be used in the context of another standard (existing or future), or in a context that does not involve a standard.

Reference to "one embodiment" or "an embodiment" or "one implementation" or "an implementation" of the present principles, as well as other variations thereof, mean that a particular feature, structure, characteristic, and so forth described in connection with the embodiment is included in at least one embodiment of the present principles. Thus, the appearances of the phrase "in one embodiment" or "in an embodiment" or "in one implementation" or "in an implementation", as well any other variations, appearing in various places throughout the specification are not necessarily all referring to the same embodiment.

Additionally, this application or its claims may refer to "determining" various pieces of information. Determining the information may include one or more of, for example, estimating the information, calculating the information, predicting the information, or retrieving the information from memory.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C" and "at least one of A, B, or C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C): This may be extended, as readily apparent by one of ordinary skill in this and related arts, for as many items listed.

Additionally, many implementations may be implemented in one or more of an encoder (for example, the encoder 1702), a decoder (for example, the decoder 1806), a post-processor (for example, the processor 1808) processing output from a decoder, or a pre-processor (for example, the processor 1701) providing input to an, encoder. Further, other implementations are contemplated by this disclosure.

The implementations described herein may be implemented in, for example, a method or a process, an apparatus, a software program, a data stream, or a signal. Even if only discussed in the context of a single form of implementation (for example, discussed only as a method), the implementation of features discussed may also be implemented in other forms (for example, an apparatus or program). An apparatus may be implemented in, for example, appropriate hardware, software, and firmware. The methods may be implemented in, for example, an apparatus such as, for example, a processor, which refers to processing devices in general, including, for example, a computer, a microprocessor, an integrated circuit, or a programmable logic device. Processors also include communication devices, such as, for example, computers, cell phones, portable/personal digital assistants ("PDAs"), and other devices that facilitate communication of information between end-users.

Implementations of the various processes and features described herein may be embodied in a variety of different equipment or applications, particularly, for example, equipment or applications associated with data encoding, data decoding, 3D modeling, 3D reconstruction, and other processing of 3D computer graphics. Examples of such equipment include an encoder, a decoder, a post-processor processing output from a decoder, a pre-processor providing input to an encoder, a video coder, a video decoder, a video codec, a web server, a set-top box, a laptop, a personal computer, a cell phone, a PDA, a game console, and other communication devices. As should be clear, the equipment may be mobile and even installed in a mobile vehicle.

Additionally, the methods may be implemented by instructions being performed by a processor, and such instructions (and/or data values produced by an implementation) may be stored on a processor-readable medium such as, for example, an integrated circuit, a software carrier or other storage device such as, for example, a hard disk, a compact diskette ("CD"), an optical disc (such as, for example, a DVD, often referred to as a digital versatile disc or a digital video disc), a random access memory ("RAM"), or a read-only memory ("ROM"). The instructions may form an application program tangibly embodied on a processor-readable medium. Instructions may be, for example, in hardware, firmware, software, or a combination. Instructions may be found in, for example, an operating system, a separate application, or a combination of the two. A processor may be characterized, therefore, as, for example, both a device configured to carry out a process and a device that includes a processor-readable medium (such as a storage device) having instructions for carrying out a process. Further, a processor-readable medium may store, in addition to or in lieu of instructions, data values produced by an implementation.

As will be evident to one of skill in the art, implementations may produce a variety of signals formatted to carry information that may be, for example, stored or transmitted. The information may include, for example, instructions for performing a method, or data produced by one of the described implementations. For example, a signal may be formatted to carry as data the rules for writing or reading the syntax of a described embodiment, or to carry as data the actual syntax-values written by a described embodiment. Such a signal may be formatted, for example, as an electromagnetic wave (for example, using a radio frequency portion of spectrum) or as a baseband signal. The formatting may include, for example, encoding a data stream and modulating a carrier with the encoded data stream. The information that the signal carries may be, for example, analog or digital information. The signal may be transmitted over a variety of different wired or wireless links, as is known. The signal may be stored on a processor-readable medium.

A number of implementations have been described. Nevertheless, it will be understood that various modifications may be made. For example, elements of different implementations may be combined, supplemented, modified, or removed to produce other implementations. Additionally, one of ordinary skill will understand that other structures and processes may be substituted for those disclosed and the resulting implementations will perform at least substantially the same function(s), in at least substantially the same way(s), to achieve at least substantially the same result(s) as the implementations disclosed. Accordingly, these and other implementations are contemplated by this application.

The invention claimed is:

1. A method, comprising:
   determining that a symbol in a sequence of symbols does not belong to a first symbol set;
   encoding a pre-determined symbol to represent the determined symbol, using a statistical model for the first symbol set and the pre-determined symbol; and
   encoding the determined symbol, using a statistical model for a second symbol set.

2. The method of claim 1, wherein the second symbol set is a superset of the first symbol set and the pre-determined symbol does not belong to the second symbol set.

3. The method of claim 1, further comprising:
   encoding a second sequence of symbols using the statistical model for the second symbol set; and
   encoding a third sequence of symbols using a statistical model for a third symbol set.

4. The method of claim 3, wherein the third symbol set is the same as the first symbol set.

5. The method of claim 3, further comprising:
   receiving geometry data of a 3D mesh;
   representing the geometry data using a tree data structure; and
   partitioning the tree data structure into three parts, wherein the sequence of symbols corresponds to a middle part of the tree data structure, the second sequence of symbols corresponds to an upper part of the tree data structure and the third sequence of symbols corresponds to a bottom part of the tree data structure.

6. The method of claim 5, the partitioning of the tree data structure comprising one of:
   including child nodes of a node, the node being associated with a second symbol, in the upper part of the tree data structure if the second symbol does not belong to the first symbol set; and
   including child nodes of the node in the middle part of the tree if the second symbol belongs to the first symbol set.

7. The method of claim 5, wherein the partitioning of the tree data structure uses at least one threshold.

8. A method, comprising:
   decoding a symbol from a bitstream, using a statistical model for a first symbol set and a pre-determined symbol;
   determining that the symbol is the pre-determined symbol; and
   decoding from the bitstream a second symbol corresponding to the determined symbol, using a statistical model for a second symbol set.

9. The method of claim 8, wherein the second symbol set is a superset of the first symbol set and the pre-determined symbol does not belong to the second symbol set.

10. The method of claim 8, further comprising:
    decoding another symbol from the bitstream, using one of the statistical model for the second symbol set and a statistical model for a third symbol set.

11. The method of claim 10, wherein the third symbol set is the same as the first symbol set.

12. The method of claim 10, further comprising:
    reconstructing a tree data structure using decoded symbols, the decoded symbols including the second symbol and the another symbol; and
    restoring geometry data of a 3D mesh from the tree data structure.

13. The method of claim 12, wherein the reconstruction of the tree data structure comprises:
    decoding symbols associated with child nodes for a node using the statistical model for the first symbol set and the pre-determined symbol, if a third symbol associated with the node belongs to the first symbol set; and
    decoding the symbols associated with the child nodes for the node using the statistical model for the second symbol set if the third symbol does not belong to the first symbol set.

14. The method of claim 12, wherein the reconstruction of the tree data structure uses at least one threshold.

15. An apparatus, comprising:
    a processor partitioning a tree data structure into three parts, wherein a first sequence of symbols corresponds to a middle part of the tree data structure, a second sequence of symbols corresponds to an upper part of the tree data structure and a third sequence of symbols corresponds to a bottom part of the tree data structure;
    a controller determining that a symbol in the first sequence of symbols does not belong to a first symbol set;
    a first entropy encoding engine encoding a pre-determined symbol to represent the determined symbol, using a statistical model for the first symbol set and the pre-determined symbol; and
    a second entropy encoder encoding the symbol and the second sequence of symbols, using a statistical model for a second symbol set, wherein the second symbol set is a superset of the first symbol set and the pre-determined symbol does not belong to the second symbol set.

16. The apparatus of claim 15, wherein child nodes of a node being included in the upper part of the tree data structure if a third symbol does not belong to the first symbol set and the child nodes of the node being included in the middle part of the tree if the third symbol belongs to the first symbol set, the node being associated with the third symbol.

17. The apparatus of claim 15, further comprising;
    an input receiving a 3D mesh; and
    a generator forming the tree data structure to represent geometry data of the 3D mesh.

18. The apparatus of claim 15, wherein the processor uses at least one threshold to partition the tree data structure.

19. An apparatus, comprising:
    a first entropy decoding engine decoding a symbol from a bitstream, using a statistical model for a first symbol set and a pre-determined symbol;
    a controller determining that the symbol is the pre-determined symbol;
    a second entropy decoding engine decoding from the bitstream a second symbol, using a statistical model for a second symbol set, wherein the second symbol set is a superset of the first symbol set; and
    a processor reconstructing a tree data structure using decoded symbols, the decoded symbols including the second symbol.

20. The apparatus of claim 19, wherein the first entropy decoding engine is used to decode symbols associated with child nodes for a node if a third symbol belongs to the first symbol set and the second entropy decoding engine is used to decode the symbols associated with the child nodes for the node if the third symbol does not belong to the first symbol set, the node being associated with the third symbol.

21. The apparatus of claim 19, wherein the tree data structure is reconstructed to represent geometry data of a 3D mesh.

22. The apparatus of claim 19, wherein the reconstruction of the tree data structure uses at least one threshold.

23. A processor readable medium having stored thereupon instructions for causing one or more processors to collectively perform;

decoding a symbol from a bitstream, using a statistical model for a first symbol set and a pre-determined symbol;

determining that the symbol is the pre-determined symbol; and decoding from the bitstream a second symbol corresponding to the determined symbol, using a statistical model for a second symbol set.

* * * * *